United States Patent
Kuo

(10) Patent No.: US 7,764,128 B2
(45) Date of Patent: Jul. 27, 2010

(54) INTEGRATED CIRCUIT WITH NON-CRYSTAL OSCILLATOR REFERENCE CLOCK

(75) Inventor: Yao H. Kuo, West Bloomfield, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 111 days.

(21) Appl. No.: 12/163,093

(22) Filed: Jun. 27, 2008

(65) Prior Publication Data
US 2009/0322400 A1   Dec. 31, 2009

(51) Int. Cl.
H03L 7/00 (2006.01)
(52) U.S. Cl. .......................................... 331/44; 331/34
(58) Field of Classification Search .................. 331/44, 331/179, 34
See application file for complete search history.

(56) References Cited

U.S. PATENT DOCUMENTS 7,295,078 B2 * 11/2007 Coppola et al. ............... 331/44
7,423,493 B2 * 9/2008 Uozumi et al. ................ 331/34
2002/0075080 A1 * 6/2002 Nelson et al. ................. 331/11
2008/0157884 A1 * 7/2008 Lee ............................. 331/44

* cited by examiner

Primary Examiner—Joseph Chang
(74) Attorney, Agent, or Firm—Fraser Clemens Martin & Miller LLC; J. Douglas Miller

(57) ABSTRACT

An integrated circuit with a non-crystal reference clock includes: an oscillator adapted to generate and transmit an oscillator output signal, wherein the oscillator includes at least one of an inductor, a resistor, and a capacitor; a comparator adapted to receive the oscillator output signal and a calibration input signal, compare the oscillator output signal characteristics and the calibration input signal characteristics, and generate and transmit a first comparator signal in response to the comparison of the oscillator output signal and the calibration input signal; a state machine adapted to receive the first comparator signal, analyze the first comparator signal and calibrate the oscillator in response to the analysis of the first comparator signal; and a controller adapted to the receive the oscillator output signal, wherein a frequency of the oscillator output signal is utilized by the controller as a clock frequency.

19 Claims, 2 Drawing Sheets

US 7,764,128 B2

INTEGRATED CIRCUIT WITH NON-CRYSTAL OSCILLATOR REFERENCE CLOCK

FIELD OF THE INVENTION

The invention relates to integrated circuits (IC). More particularly, the invention is directed to a controller IC having a non-crystal oscillator reference clock.

BACKGROUND OF THE INVENTION

Currently, all micro-controller integrated circuits (ICs) require a reference clock frequency. Typically, the reference clock frequency is generated by a crystal oscillator. The crystal is usually large in comparison to the IC size. The crystal size limits the IC package design and implementation. Although crystals may be used to produce an accurate reference clock frequency, crystals are relatively expensive compared to the cost of IC silicon.

It would be desirable to have a cost effective integrated circuit and a method for generating an accurate clock reference for the integrated circuit, wherein the integrated circuit is calibrated without the use of a crystal.

SUMMARY OF THE INVENTION

Concordant and consistent with the present invention, a cost effective integrated circuit and a method for generating an accurate clock reference for the integrated circuit, wherein the integrated circuit is calibrated without the use of a crystal, have surprisingly been discovered.

In one embodiment, an integrated circuit comprises: an oscillator adapted to generate and transmit an oscillator output signal, wherein the oscillator includes at least one of an inductor, a resistor, and a capacitor; a comparator adapted to receive the oscillator output signal and a calibration input signal, compare the oscillator output signal characteristics and the calibration input signal characteristics, and generate and transmit a first comparator signal in response to the comparison of the oscillator output signal and the calibration input signal; a state machine adapted to receive the first comparator signal, analyze the first comparator signal and calibrate the oscillator in response to the analysis of the first comparator signal; and a controller adapted to the receive the oscillator output signal, wherein a frequency of the oscillator output signal is referenced by the controller as a clock frequency.

In another embodiment, an integrated circuit comprises: an oscillator adapted to generate and transmit an oscillator output signal, wherein the oscillator includes at least one of an inductor, a resistor, and a capacitor; a calibration input adapted to receive at least one reference signal and transmit a calibration input signal in response to the received at least one reference signal; a comparator adapted to receive the oscillator output signal and the calibration input signal, compare the oscillator output signal characteristics and the calibration input signal, and generate and transmit a plurality of comparator signals in response to the comparison of the oscillator output signal and the calibration input signal; a state machine adapted to receive the comparator signals, analyze the comparator signals, and calibrate the oscillator in response to the analysis of the comparator signals; and a controller adapted to the receive the oscillator output signal, wherein a frequency of the oscillator output signal is referenced by the controller as a clock frequency.

The invention also provides methods for generating an accurate clock reference for an integrated circuit.

One method comprises the steps of: providing an oscillator adapted to generate and transmit an oscillator output signal, wherein the oscillator includes a variable component and at least one of an inductor, a resistor, and a capacitor; providing a calibration system adapted to transmit at least one reference signal; comparing the oscillator output signal with the at least one reference signal; and calibrating the variable component of the oscillator in response to the comparison of the oscillator output signal and the at least one reference signal.

BRIEF DESCRIPTION OF THE DRAWINGS

The above, as well as other advantages of the present invention, will become readily apparent to those skilled in the art from the following detailed description of the preferred embodiment when considered in the light of the accompanying drawings in which.

DETAILED DESCRIPTION OF EXEMPLARY EMBODIMENTS OF THE INVENTION

The following detailed description and appended drawings describe and illustrate various embodiments of the invention. The description and drawings serve to enable one skilled in the art to make and use the invention, and are not intended to limit the scope of the invention in any manner. In respect of the methods disclosed, the steps presented are exemplary in nature, and thus, the order of the steps is not necessary or critical.

Figure 1:
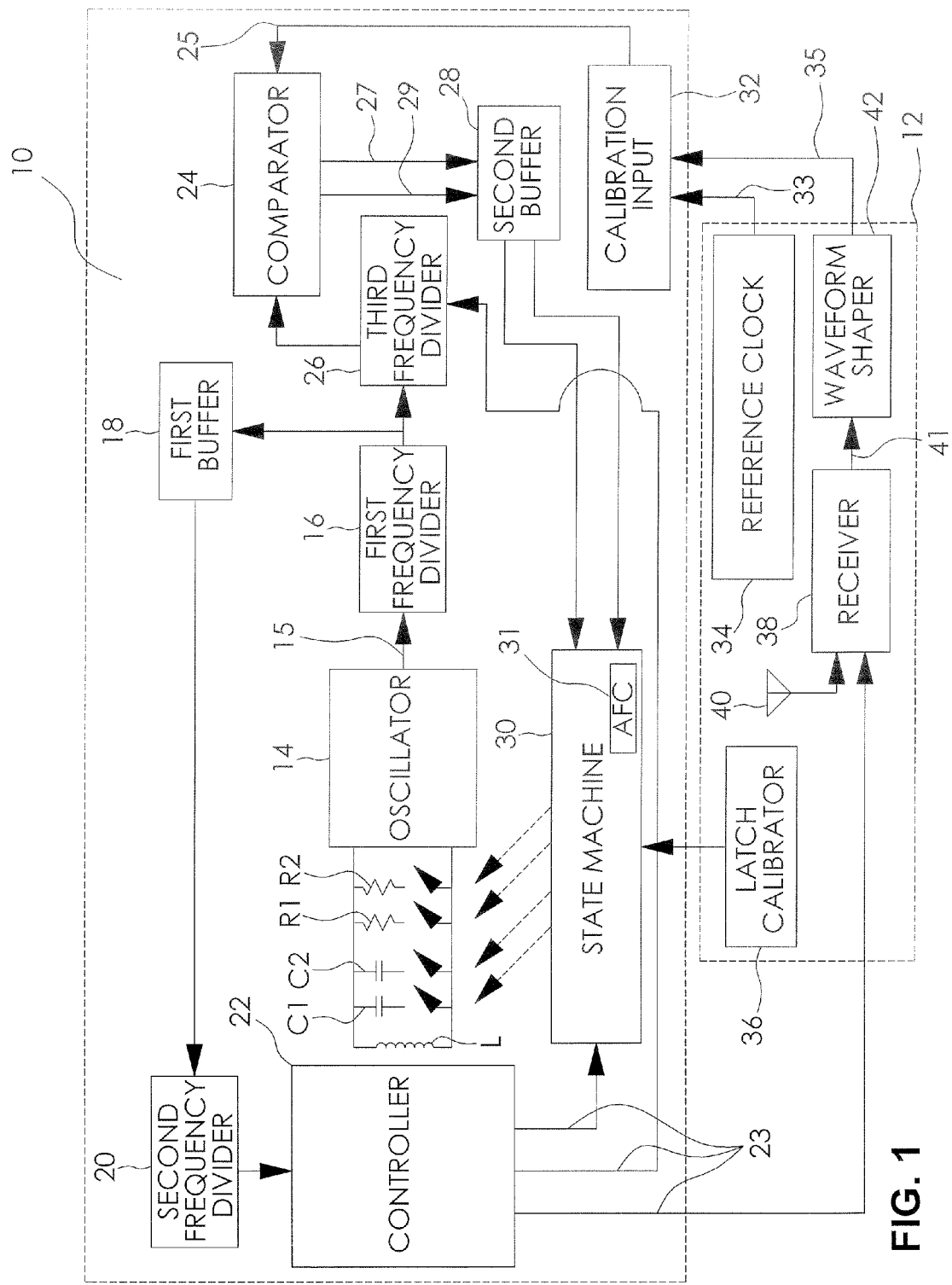
FIG. 1 is a schematic block diagram of an integrated circuit in communication with a calibration system according to an embodiment of the present invention.

FIG. 1 illustrates a controller integrated circuit 10, hereinafter IC 10, in cooperation with a calibration system 12, according to an embodiment of the present invention. The IC 10 includes an oscillator 14, a first frequency divider 16, a first buffer 18, a second frequency divider 20, a controller 22, a comparator 24, a third frequency divider 26, a second buffer 28, a state machine 30, and a calibration input 32. It is understood that additional components may be included in the IC 10, as desired. Specifically, the IC 10 may include diodes and other components for regulating electrical variations in response to temperature changes. It is further understood that the IC 10 may include any number of frequency dividers, buffers, and other signal regulators and modifiers, as desired.

The oscillator 14 may be any oscillator circuit adapted to generate an oscillator output signal 15. In certain embodiments, the oscillator 14 is an Inductor-Capacitor (L-C) oscillator including at least one inductor and at least one capacitor. In other embodiments, the oscillator 14 may include a plurality of switching capacitors or resistors in addition to or as an alternative to the inductor and capacitor. As shown in FIG. 1, the oscillator 14 includes one inductor L, a plurality of switching capacitors C1, C2 and a plurality of switching resistors R1, R2 connected in parallel. It is understood that any number of inductors, capacitors, and resistors may be used, as desired. It is further understood that any electrical arrangement may be used, as desired. In certain embodiments, the oscillator output signal 15 has a frequency on the order of several gigahertz (GHz); however, any frequency may be generated, as desired. As shown, the oscillator 14 is in direct communication with a first frequency divider 16. The frequency divider 16 receives the oscillator output signal 15 and reduces the frequency of the oscillator output signal 15 to a desired frequency. It is understood that the division ratio of the first frequency divider 16 may be adjusted, as desired. It is further understood that an oscillator temperature compensation profile can be included by hardware or software, as desired. Specifically, the oscillator 14 and/or the IC 10 may include diodes and other components for regulating electrical variations in response to temperature changes.

The first buffer 18 is adapted to receive the oscillator output signal 15 from the first frequency divider 16 and transmit the oscillator output signal 15 to the controller 22. The first buffer 18 may be any buffer circuit for providing an electrical impedance transformation between one electrical circuit and another electrical circuit. It is understood that the first buffer 18 may be calibrated in response to the input impedance of the controller 22, for example. In certain embodiments, the second frequency divider 20 is interconnected between the first buffer 18 and the controller 22 to provide another frequency divide based on a desired input frequency of the controller 22. It is understood that any division ratio of the second frequency divider 20 may be used, as appropriate.

The controller 22 may be any micro-controller or processor requiring a reference clock frequency. As such, the controller 22 is adapted to receive the oscillator output signal 15 as the reference clock frequency. It is understood that the oscillator output signal 15 may be received by the controller 22 directly from the first buffer 18 or indirectly thought additional circuitry, such as the second frequency divider 20, for example. The controller 22 may also be adapted to provide a plurality of control signals 23 to at least one of the calibration system 12, the state machine 30, and the third frequency divider 26. The control signals 23 may include data and information for controlling and regulating a particular component of the IC 10 and/or the calibration system 12. It is understood that the controller 22 may be in communication with any device and system, as desired.

The comparator 24 may be any comparator device, circuit, or system adapted to compare the characteristics of the oscillator output signal 15 with the characteristics of a calibration input signal 25 and transmit an output in response to the comparison. As shown, the comparator 24 is a phase comparator circuit adapted to compare the phase characteristics of the oscillator output signal 15 with the phase characteristics of a calibration input signal 25. Other characteristics of the received signals may be compared, as desired. In certain embodiments, the comparator 24 may be adapted to receive the oscillator output signal 15 directly from the first frequency divider 16. In other embodiments, the comparator 24 may be adapted to receive the oscillator output signal 15 directly from the oscillator 14. As shown, the comparator 24 is adapted to transmit a first comparator output 27, referred to as an UP output and a second comparator output 29, known as a DOWN output. It is understood that the comparator outputs 27, 29 cooperate to represent a phase comparison between the calibration input signal 25 and the oscillator output signal 15. As a non-limiting example, the first comparator output 27 represents a comparison where the calibration input signal 25 is leading the oscillator output signal 15. As a further example, the second comparator output 29 represents a comparison where the oscillator output signal 15 is leading the calibration input signal 25. The comparator 24 may include any number of comparator outputs 27, 29, as desired. The comparator outputs 27, 29 may represent any characteristic of the comparison, as desired.

In the embodiment shown, the third frequency divider 26 is interconnected between the first frequency divider 16 and the comparator 24 to provide a further frequency divide based on a desired input frequency of the comparator 24. It is understood that any division ratio of the third frequency divider 26 may be used, as appropriate. It is further understood that the third frequency divider 26 may be calibrated in response to one of the control signals 23 transmitted by the controller 22.

The second buffer 28 is interconnected between the comparator 24 and the state machine 30. The second buffer 28 is adapted to receive the first comparator output 27 and the second comparator output 29 from the comparator 24 and transmit the comparator outputs 27, 29 to the state machine 30. The second buffer 28 may be any buffer circuit for providing an electrical impedance transformation between one electrical circuit and another electrical circuit. It is understood that the second buffer 28 may be calibrated in response to the input impedance of the state machine 30, for example.

The state machine 30 is adapted to receive the comparator outputs 27, 29 and control the variable components of the oscillator 14 in response to the received comparator outputs 27, 29. In certain embodiments, the state machine 20 is adapted to control each of the switching capacitors C1, C2 and/or the switching resistors R1, R2, thereby modulating the oscillator output signal 15 to match the phase of the calibration input signal 25. It is understood that where the oscillator 14 includes other variable components, the state machine 30 may be adapted to calibrate and vary each variable component in response to the received comparator outputs 27, 29. It is further understood that the oscillator output signal 15 may be modulated to match other characteristics of the calibration input signal 25, as desired. As shown, the state machine 30 includes an auto frequency control (AFC) 31. The AFC 31 is adapted to smooth frequency variations in the received comparator signals 27, 29. It is understood that any device or system may be used to smooth the frequency variations in signals received by the state machine 30, as desired.

The calibration input 32 is adapted to cooperate with the calibration system 12 for receiving a plurality of reference signals 33, 35 from the calibration system 12, wherein each of the reference signals 33, 35 include a desired signal characteristic. The calibration input 32 is further adapted to transmit the calibration input signal 25 to the comparator 24, wherein the calibration input signal 25 represents at least one reference signal 33, 35. In certain embodiments, the calibration input 32 transmits the calibration input signal 25 with substantially the same characteristics as one of the reference signals 33, 35. In other embodiments, the calibration input 32 may be adapted to modify the characteristics of the reference signals 33, 35 before transmitting the calibration input signal 25. It is understood that the calibration input 32 may be directly connected to the calibration system 12. As a non-limiting example, the connection between the calibration input 32 and the calibration system 12 may be a wireless connection.

The calibration system 12 is adapted to transmit the reference signals 33, 35 to the calibration input 32. As shown, the calibration system 12 is adapted to transmit a first reference signal 33 and a second reference signal 35. In certain embodiments, the calibration system 12 includes a reference clock 34 adapted to generate and transmit the first reference signal 33 to the calibration input 32. As such, the reference clock 34 may be adapted to control the signal characteristics of the generated first reference signal 33 such as a frequency and phase, for example. It is understood that the reference clock 34 may be any device or system for generating the desired first reference signal 33, as appropriate. As shown, the calibration system may also include a latch calibrator 36 for directly adjusting the state machine 30 and thereby the oscillator 14. It is understood that the latch calibrator 36 may be any device or system for directly adjusting the settings of the state machine 30, as desired.

In the embodiment shown, the calibration system 12 also includes a receiver 38 in cooperation with an antenna 40. As such, the antenna 40 cooperates with the receiver 38 to receive a transmitted broadcast signal having a pilot waveform 41. It is understood that the receiver 38 may be adapted to receive any range of broadcast frequencies, as desired. It is further understood that the receiver 38 may be adapted to receive any broadcast signals, such as radio or cellular telephone, for example. The receiver 38 is also adapted to cooperate with a waveform shaper 42 to strip out the pilot waveform 41, modify the pilot waveform 41, and transmit the modified pilot waveform as the second reference signal 35. As a non-limiting example, the pilot waveform 41 may be a FM radio pilot waveform broadcast at 19 kHz, as is known in the art of radio broadcasting. As such, the receiver 38 and waveform shaper 42 cooperate to extract the pilot waveform 41 from the received broadcast signal and transmit the second reference signal 35, representing the pilot waveform 41. It is understood, that any pilot waveform may be received and extracted, as desired. It is also understood that the receiver 38, the antenna 40, and the waveform shaper 42 may be included on the IC 10 for post-installation calibration of the IC 10 without having to remove the IC 10 from its environment.

In operation, the oscillator 14 generates and transmits the oscillator output signal 15. The oscillator output signal 15 is received by the first frequency divider 16 and the frequency of the oscillator output signal 15 is reduced to a desired frequency. The first frequency divider 16 transmits the oscillator output signal 15 to the controller 22, wherein the controller receives the oscillator output signal 15 as a clock reference, having a desired frequency. It is understood that the controller 22 may be electrically isolated by the first buffer 18. It is further understood that the second frequency divider 20 may modify the frequency of the oscillator output signal 15 before the controller 20 receives the oscillator output signal 15.

The desired frequency of the oscillator output signal 15 and thereby the frequency of the clock reference for the controller 20 may be modified at any time. In certain embodiments, the IC 10 may be calibrated in a pre-installation process, wherein the IC 10 is coupled to test equipment including at least the calibration system 12. As such, the calibration system 12 transmits the first reference signal 33, having a pre-determined frequency, to the IC 10. The calibration input 32 of the IC 10 receives the first reference signal 33 and routes the calibration input signal 25 to the comparator 24. In response to the comparison of the calibration input signal 25 with the oscillator output signal 15, the comparator 24 transmits the comparator outputs 27, 29 to the state machine 30. The state machine 30 receives the comparator outputs 27, 29 and adjusts the state of the switching capacitors C1, C2 and/or the switching resistors R1, R2 to fix the oscillator output signal 15 frequency. Once the oscillator 14 is calibrated to generate the oscillator output frequency 15 having a desired frequency, the IC 10 may be separated from the calibration system 12 and installed in a desired environment. It is understood that the oscillator 14 may be calibrated to operate at any desired frequency and in any desired environment. In another embodiment, the IC 10 may be calibrated in real-time. Specifically, the antenna 40 receives a broadcast signal (not shown) having a pilot waveform 41. The receiver 38 in cooperation with the waveform shaper 42 extracts the pilot waveform 41 from the received broadcast signal and transmits the extracted pilot waveform 41 as the second reference signal 35. The calibration input 32 of the IC 10 receives the second reference signal 35 and routes the calibration input signal 25 to the comparator 24. In response to the comparison of the calibration input signal 25 with the oscillator output signal 15, the comparator 24 transmits the comparator outputs 27, 29 to the state machine 30. The state machine 30 receives the comparator outputs 27, 29 and adjusts the state of the switching capacitors C1, C2 and/or switching resistors R1, R2 to fix the oscillator output signal 15 frequency. The real-time calibration provides a user the ability to set an accurate reference clock frequency without having to un-install the IC 10 and couple the IC 10 to test equipment for calibration. It is understood that the oscillator 14 may be calibrated to operate at any desired frequency and in any desired environment.

Figure 2:
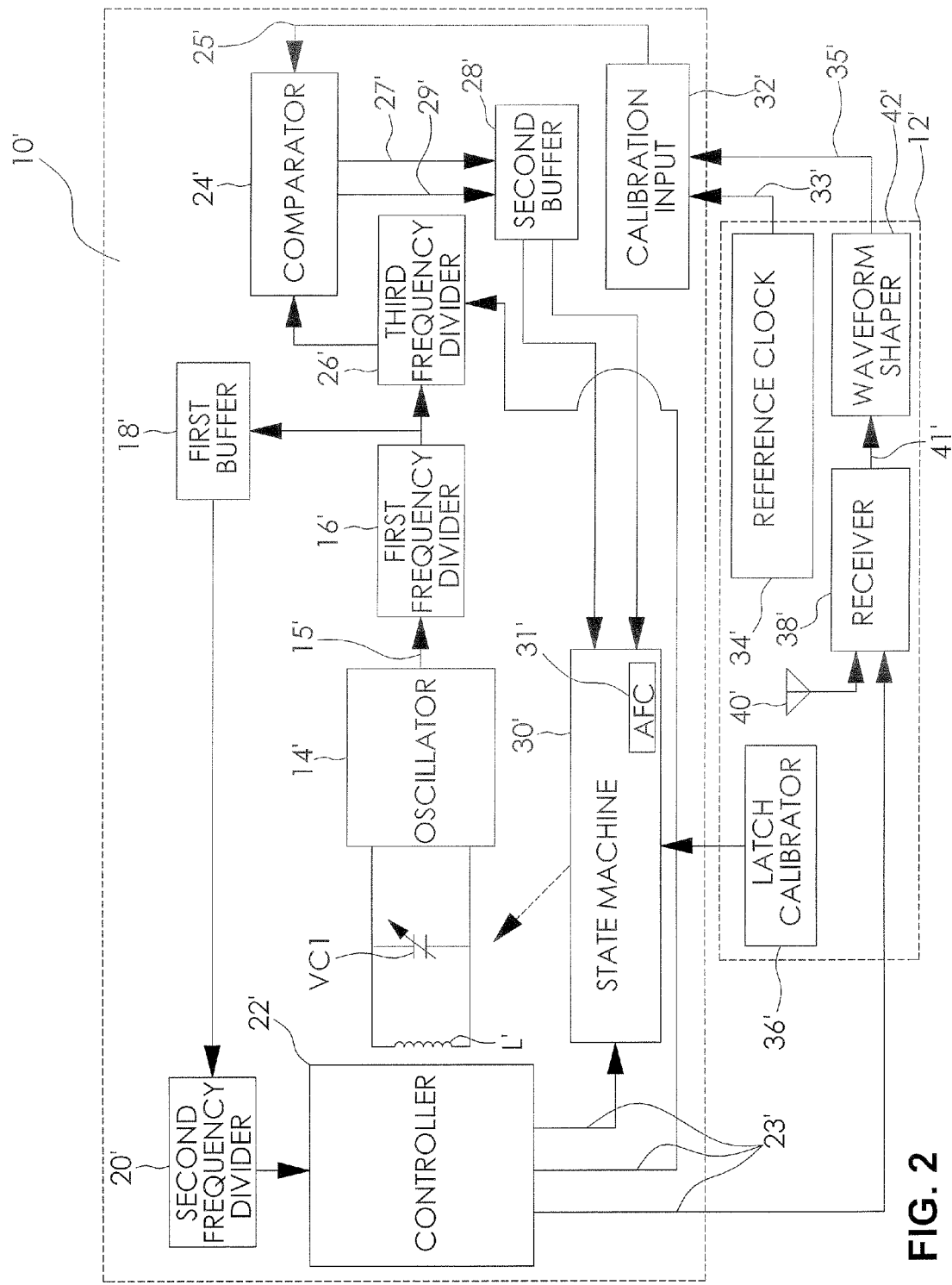
FIG. 2 is a schematic block diagram of an integrated circuit in communication with a calibration system according to another embodiment of the present invention.

FIG. 2 illustrates a controller IC 10' in cooperation with a calibration system 12', according to another embodiment of the present invention similar to the IC 10 of FIG. 1, except as described below. Structure repeated from the description of FIG. 1 includes the same reference numeral and a prime (') symbol. As shown in FIG. 2, the oscillator 14' includes one inductor L' and a variable capacitor VC1 connected in parallel. It is understood that any number of inductors and capacitors may be used, as desired. It is further understood that any electrical arrangement may be used, as desired. As such, the state machine 30' is adapted to control the variable capacitor VC1 in response to the received comparator outputs 27', 29'.

In operation, the oscillator 14' generates and transmits the oscillator output signal 15'. The oscillator output signal 15' is received by the first frequency divider 16' and the frequency of the oscillator output signal 15' is reduced to a desired frequency. The first frequency divider 16' transmits the oscillator output signal 15' to the controller 22', wherein the controller receives the oscillator output signal 15' as a clock reference, having a desired frequency. It is understood that the controller 22' may be electrically isolated by the first buffer 18'. It is further understood that the second frequency divider 20' may modify the frequency of the oscillator output signal 15' before the controller 20' receives the oscillator output signal 15'.

The desired frequency of the oscillator output signal 15' and thereby the frequency of the clock reference for the controller 20' may be modified at any time. In certain embodiments, the IC 10' may be calibrated in a pre-installation process, wherein the IC 10' is coupled to test equipment including at least the calibration system 12'. As such, the calibration system 12' transmits the first reference signal 33', having a pre-determined frequency, to the IC 10'. The calibration input 32' of the IC 10' receives the first reference signal 33' and routes the calibration input signal 25' to the comparator 24'. In response to the comparison of the calibration input signal 25' with the oscillator output signal 15', the comparator 24' transmits the comparator outputs 27', 29' to the state machine 30'. The state machine 30' receives the comparator outputs 27', 29' and adjusts the variable capacitor VC1 to fix the oscillator output signal 15 frequency. Once the oscillator 14' is calibrated to generate the oscillator output frequency 15' having a desired frequency, the IC 10' may be separated from the calibration system 12' and installed in a desired environment. It is understood that the oscillator 14' may be calibrated to operate at any desired frequency and in any desired environment. In another embodiment, the IC 10' may be calibrated in real-time. Specifically, the antenna 40' receives a broadcast signal (not shown) having a pilot waveform 41'. The receiver 38' in cooperation with the waveform shaper 42' extracts the pilot waveform 41' from the received broadcast signal and transmits the extracted pilot waveform 41' as the second reference signal 35'. The calibration input 32' of the IC 10' receives the second reference signal 35' and routes the calibration input signal 25' to the comparator 24'. In response to the comparison of the calibration input signal 25' with the oscillator output signal 15', the comparator 24' transmits the comparator outputs 27', 29' to the state machine 30'. The state machine 30' receives the comparator outputs 27', 29' and adjusts the variable capacitor VC1 to fix the oscillator output signal 15' frequency. The real-time calibration provides a user the ability to set an accurate reference clock frequency without having to un-install the IC 10' and couple the IC 10' to test equipment for calibration. It is understood that the oscillator 14' may be calibrated to operate at any desired frequency and in any desired environment.

The IC 10, 10' provides an accurate calibration of the clock reference frequency without the use of a crystal oscillator. The IC 10, 10', in cooperation with the calibration system 12, 12', may be accurately calibrated for a particular environment having known conditions. The IC 10, 10', in cooperation with the calibration system 12, 12', may also be calibrated in real-time for post-installation modifications.

From the foregoing description, one ordinarily skilled in the art can easily ascertain the essential characteristics of this invention and, without departing from the spirit and scope thereof, make various changes and modifications to the invention to adapt it to various usages and conditions.

What is claimed is:

1. An integrated circuit comprising:
   an oscillator adapted to generate and transmit an oscillator output signal, wherein the oscillator includes at least one of an inductor, a resistor, and a capacitor;
   a comparator adapted to receive the oscillator output signal and a calibration input signal, compare the oscillator output signal characteristics and the calibration input signal characteristics, and generate and transmit a first comparator signal in response to the comparison of the oscillator output signal and the calibration input signal;
   a state machine adapted to receive the first comparator signal, analyze the first comparator signal and calibrate the oscillator in response to the analysis of the first comparator signal; and
   a controller adapted to the receive the oscillator output signal, wherein a frequency of the oscillator output signal is utilized by the controller as a clock frequency.

2. The integrated circuit according to claim 1, wherein the oscillator further includes at least one of a variable capacitor, a plurality of switching capacitors, and a plurality of switching resistors.

3. The integrated circuit according to claim 1, wherein the comparator is a phase comparator.

4. The integrated circuit according to claim 1, further including a calibration input adapted to receive at least one reference signal and transmit a calibration input signal in response to the received at least one reference signal.

5. The integrated circuit according to claim 4, wherein the at least one reference signal is transmitted to the calibration input by a calibration system in communication with the integrated circuit, the calibration system including a reference clock adapted to generate the at least one reference signal having a pre-determined frequency.

6. The integrated circuit according to claim 4, wherein the at least one reference signal is transmitted to the calibration input by a calibration system in communication with the integrated circuit, the calibration system including a receiver coupled to an antenna and a waveform shaper, the receiver adapted to cooperate with the antenna and the waveform shaper to receive a broadcast signal and extract a pilot waveform to be transmitted as the at least one reference signal.

7. The integrated circuit according to claim 1, wherein the comparator is adapted to generate and transmit a second comparator signal in response to the comparison of the oscillator output signal and the calibration input signal and the state machine is adapted to receive the second comparator signal, analyze the second comparator signal and calibrate the oscillator in response to the analysis of the first comparator signal and the second comparator signal.

8. The integrated circuit according to claim 1, further including at least one frequency divider adapted to receive the oscillator output signal, modify the frequency of the oscillator output signal to a desired frequency, and transmit the oscillator output signal having the desired frequency.

9. The integrated circuit according to claim 1, further including at least one buffer circuit for providing an electrical impedance transformation between the oscillator and the controller or the comparator and the state machine.

10. An integrated circuit comprising:
    an oscillator adapted to generate and transmit an oscillator output signal, wherein the oscillator includes at least one of an inductor, a resistor, and a capacitor;
    a calibration input adapted to receive at least one reference signal and transmit a calibration input signal in response to the received at least one reference signal;
    a comparator adapted to receive the oscillator output signal and the calibration input signal, compare the oscillator output signal and the calibration input signal, and generate and transmit a plurality of comparator signals in response to the comparison of the oscillator output signal and the calibration input signal;
    a state machine adapted to receive the comparator signals, analyze the comparator signals, and calibrate the oscillator in response to the analysis of the comparator signals;
    a frequency divider to receive the oscillator output signal, modify the frequency of the oscillator output signal to a desired frequency, and transmit the oscillator output signal having the desired frequency; and
    a controller adapted to the receive the oscillator output signal from the frequency divider, wherein a frequency of the oscillator output signal is utilized by the controller as a clock frequency.

11. The integrated circuit according to claim 10, wherein the oscillator further includes at least one of a variable capacitor, a plurality of switching capacitors, and a plurality of switching resistors.

12. The integrated circuit according to claim 10, wherein the comparator is a phase comparator.

13. The integrated circuit according to claim 10, wherein the at least one reference signal is transmitted to the calibration input by a calibration system in communication with the integrated circuit, the calibration system including a reference clock adapted to generate the at least one reference signal having a pre-determined frequency.

14. The integrated circuit according to claim 10, wherein the at least one reference signal is transmitted to the calibration input by a calibration system in communication with the integrated circuit, the calibration system including a receiver coupled to an antenna and a waveform shaper, the receiver adapted to cooperate with the antenna and the waveform shaper to receive a broadcast signal and extract a pilot waveform to be transmitted as the at least one reference signal.

15. The integrated circuit according to claim 10, further including at least one buffer circuit for providing an electrical impedance transformation between the oscillator and the controller or the comparator and the state machine.

16. A method for generating an accurate clock reference for an integrated circuit, the method comprising the steps of:
- providing an oscillator adapted to generate and transmit an oscillator output signal, wherein the oscillator includes a variable component and at least one of an inductor, a resistor, and a capacitor;
- providing a controller adapted to the receive the oscillator output signal, wherein a frequency of the oscillator output signal is utilized by the controller as a clock frequency;
- providing a calibration system adapted to transmit at least one reference signal;
- comparing the oscillator output signal with the at least one reference signal; and
- calibrating the variable component of the oscillator in response to the comparison of the oscillator output signal and the at least one reference signal.

17. The method according to claim 16, wherein the variable component is one of a variable capacitor, a plurality of switching capacitors, and a plurality of switching resistors.

18. The method according to claim 16, wherein the calibration system includes a reference clock adapted to provide the at least one reference signal.

19. The method according to claim 16, wherein the calibration system includes a receiver coupled to an antenna and a waveform shaper, the receiver adapted to cooperate with the antenna and the waveform shaper to receive a broadcast signal and extract a pilot waveform to be transmitted as the at least one reference signal.

* * * * *